(12) United States Patent
Teague et al.

(10) Patent No.: US 12,132,130 B2
(45) Date of Patent: Oct. 29, 2024

(54) STACKED THIN-FILM PHOTOCONDUCTIVE SEMICONDUCTOR SWITCH

(71) Applicant: Government of the United States, as represented by the Secretary of the Air Force, Wright-Patterson AFB, OH (US)

(72) Inventors: Joseph D. Teague, Albuquerque, NM (US); Joseph Neil Merrett, Decherd, TN (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 380 days.

(21) Appl. No.: 17/647,037

(22) Filed: Jan. 5, 2022

(65) Prior Publication Data

US 2022/0271181 A1    Aug. 25, 2022

Related U.S. Application Data

(60) Provisional application No. 63/151,874, filed on Feb. 22, 2021.

(51) Int. Cl.
   *H01L 31/08*    (2006.01)
   *H03K 17/78*    (2006.01)

(52) U.S. Cl.
   CPC ............ *H01L 31/08* (2013.01); *H03K 17/78* (2013.01)

(58) Field of Classification Search
   CPC ......... H01L 31/08; H01L 31/09; H01L 31/16; H03K 17/78; H03K 17/51
   See application file for complete search history.

(56) References Cited

U.S. PATENT DOCUMENTS

| | | | | |
|---|---|---|---|---|
| 3,917,943 A | * | 11/1975 | Auston | H01L 31/09 257/E31.093 |
| 4,376,285 A | * | 3/1983 | Leonberger | H01L 31/162 257/664 |
| 4,449,140 A | * | 5/1984 | Board | H01L 29/74 257/107 |
| 5,051,789 A | * | 9/1991 | Rosen | H01L 31/167 257/458 |

(Continued)

*Primary Examiner* — John R Lee
(74) *Attorney, Agent, or Firm* — AFMCLO/JAZ; Richard M. Mescher

(57) ABSTRACT

A photoconductive semiconductor switch (PCSS) comprises a plurality of planar semiconductor layers, adjacent semiconductor layers separated by an insulation layer, forming a thin-film stack; a pair electrical contacts fixed to a perimeter of each of the semiconductor layers; an optical source arranged to project light of a predetermined wavelength through the plurality of semiconductor layers. The thin-film stack may comprise at least 10 layers of alternating semiconductor and insulating layers. The semiconductor and insulator layers consist of at least one of GaAs, GaN, GaP, AlN, GaSe, ZnSe, ZnTe, GaSb, InAs, GaN, AlAs, InP, CdS, InSe, CdTe, HgTe, InSb, AlSb, and AlGaN. The contacts consist of at least one of a doped semiconductor material. The optical source illuminates the thin-film stack from at least one of their edges, i.e. parallel to the thin-film layers, or straight through the thin-film stack, i.e. perpendicular to the thin-film layers, or any angle in between.

11 Claims, 3 Drawing Sheets

(56) References Cited

U.S. PATENT DOCUMENTS

| | | | | |
|---|---|---|---|---|
| 5,291,056 | A * | 3/1994 | Howson | H01L 31/162 |
| | | | | 257/E31.093 |
| 5,811,841 | A * | 9/1998 | Ganguly | H01L 31/08 |
| | | | | 257/431 |
| 7,173,295 | B1 * | 2/2007 | Mar | H01L 31/125 |
| | | | | 257/466 |
| 9,018,646 | B2 * | 4/2015 | Sartorius | H01L 31/03042 |
| | | | | 257/85 |
| 9,147,789 | B2 * | 9/2015 | Sartorius | H01L 31/1844 |
| 10,403,780 | B2 * | 9/2019 | Jang | H01L 31/1075 |
| 11,837,468 | B2 * | 12/2023 | Cho | H01L 21/02502 |
| 2022/0271181 | A1 * | 8/2022 | Teague | H01L 31/08 |
| 2022/0320360 | A1 * | 10/2022 | DeJarld | H01L 31/03044 |
| 2023/0070932 | A1 * | 3/2023 | Merrett | H01L 31/1136 |
| 2024/0097064 | A1 * | 3/2024 | Koehler | H01L 31/102 |

* cited by examiner

STACKED THIN-FILM PHOTOCONDUCTIVE SEMICONDUCTOR SWITCH

Pursuant to 37 C.F.R. § 1.78(a)(4), this application claims the benefit of and priority to prior filed Provisional Application Ser. No. 63/151,874, filed 22 Feb. 2021, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to photoconductive semiconductor switches (PCSS) and, more particularly, to an integrated multilayer PCSS incorporating a plurality of stacked semiconductor thin-films.

BACKGROUND OF THE INVENTION

Current PCSS are monolithic devices, with a single current carrying layer, often 500 micrometers in thickness or more. Known devices are single units and are placed in parallel by hand, taking up far more space, and requiring much more time to construct. What is desired is a device that would integrate several of these devices in the same footprint in order to greatly increase their current carrying capability via parallelization. Such a PCSS would be useful in the directed energy, pulsed power, medical, and high energy physics fields. It may also be used in electrical power conversion (AC/DC or DC/DC) and isolation. This device may also be used to provide "hardening" to an electronic system, reducing its electromagnetic susceptibility when used in place of a traditional transistor.

SUMMARY OF THE INVENTION

The present invention overcomes the foregoing problems and other shortcomings, drawbacks, and challenges of PCSS devices capable of handling high power loads. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a photoconductive semiconductor switch (PCSS) comprises a plurality of planar semiconductor layers, adjacent semiconductor layers separated by an insulation layer, forming a thin-film stack; a pair electrical contacts fixed to a perimeter of each of the semiconductor layers; an optical source arranged to project light of a predetermined wavelength through the plurality of semiconductor layers.

The thin-film stack may include at least 10 layers of alternating semiconductor and insulating layers, or it may be as few as three layers, i.e. a first PCSS layer, an insulating layer, and a second PCSS layer.

The semiconductor and insulator layers may include at least one of GaAs, GaN, GaP, AlN, GaSe, ZnSe, ZnTe, GaSb, InAs, GaN, AlAs, InP, CdS, InSe, CdTe, HgTe, InSb, AlSb, and AlGaN, as well as Si, C (diamond), and SiC.

The contacts consist of at least one of a doped semiconductor material, Sc, Ti, V, Cr, Mn, Fe, Co, Ni, Cu, Zn, Y, Zr, Nb, Mo, Ru, Rh, Pd, Ag, Cd, Ir, Pt, and Au. Good electrical conductivity is important for the contacts.

The optical source may be arranged so as to illuminate the thin-film stack from at least one of their edges, i.e. parallel to the thin-film layers, straight through the thin-film stack, i.e. perpendicular to the thin-film layers, or any angle in between.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Through the use of thin-film semiconductor rather than bulk material, the costs inherent in PCSS device fabrication may be substantially reduced. However, this reduces the current-carrying capability of the device substantially due to the decreased cross-sectional area. However, by vertically or horizontally layering these thin-film switches, with an insulating layer between each, multiple devices may be triggered at once, thus spreading the current across multiple devices and increasing the effective cross-sectional area of the switch.

Figure 1:
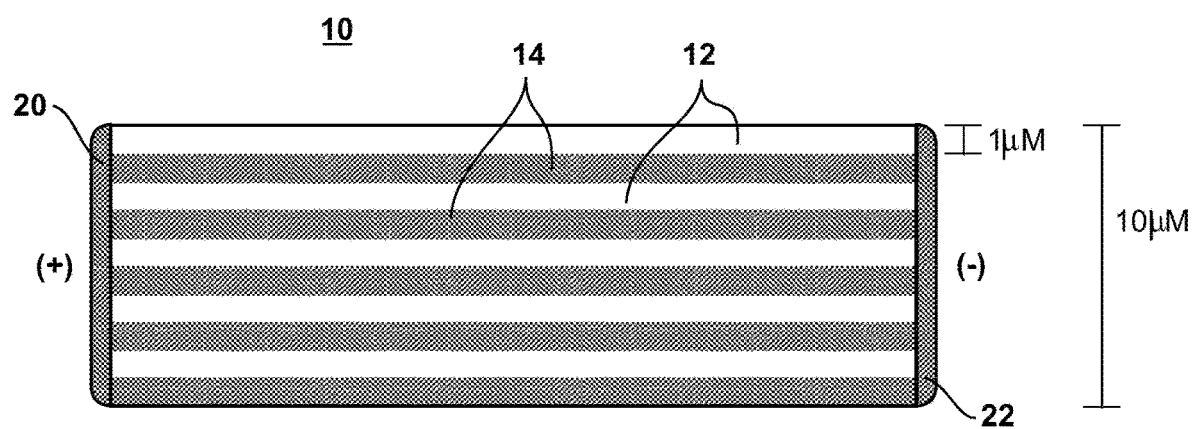
FIG. 1 is a sectional view of a PCSS device.

As depicted in FIG. 1, the thin-film stack PCSS device 10 uses thin (i.e. nm or μm) thickness layers of a PCSS material 12 (white layers) alternated with an insulating material 14 (gray layers), which may be lattice-matched, e.g. GaN with AlGaN, or strain-balanced, and which may be grown by ALD (atomic layer deposition) or MBE (molecular beam epitaxy) processes. This allows for the integration of multiple parallel devices in a very small footprint. Whereas prior art bulk PCSS devices might have one switch with a thickness of 500 μm, this invention would fit 250 or more switches into the same space. Additionally, there are predicted increases in efficiency due to quantum well charge conduction, similar to HEMT transistors, due to the lattice-matched insulating layer. The layers being 'lattice-matched' refers to adjacent layers of the thin-film stack PCSS device having similar crystal lattice structures so that they grow with minimal strain and defects. The thin layers described above may be nanometer (nm) scale or micrometer (μm) scale, or even 10 s of μm, depending upon the intended application and desired performance characteristics.

Figure 2:
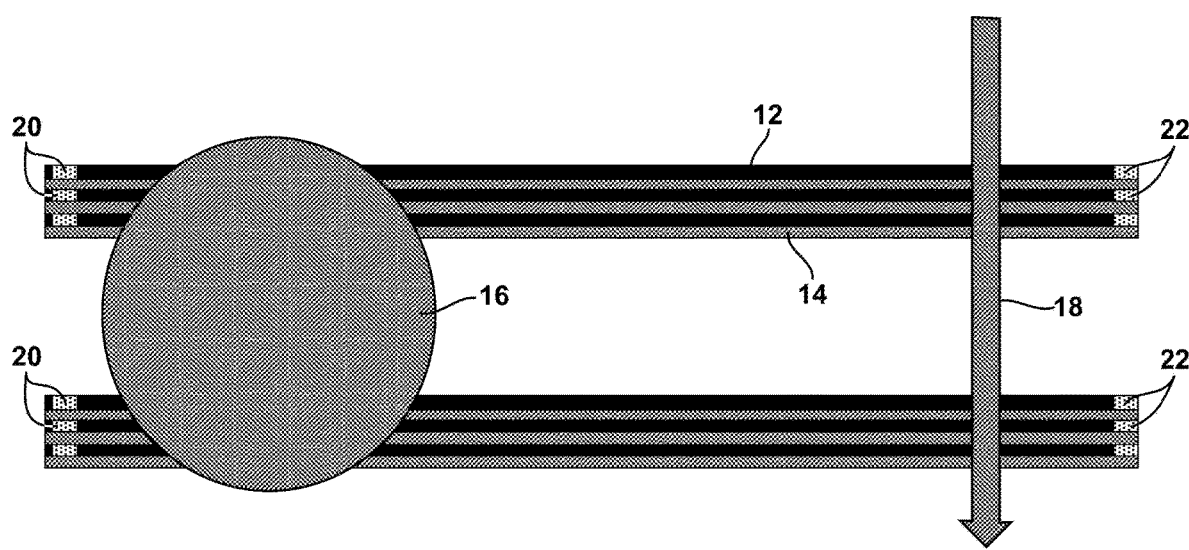
FIG. 2 is a sectional view of a PCSS device intersected by an optical source.

FIG. 2 presents a sectional view of a PCSS device 10 intersected by an optical source 16. The optical source 16 is depicted extending into the page. As illustrated in FIG. 2, a thin-film stack PCSS 10 may comprise stacked layers of a PCSS material 12 (e.g. GaAs, GaN, AlN or other suitable semiconductors) alternated with an insulating layer 14 (e.g. GaN alternated with AlGaN). The insulating layer 14 may be lattice-matched. Contacts 20, 22 may be adhered to each layer, creating a stacked array of switches. When illuminated by a suitable optical source 16, each PCSS layer becomes capable of conducting current 18. By using multiple thin switches rather than one thick switch, the user can take advantage of the parallel resistances to increase current carrying capacity and decrease energy loss due to resistive heating. The contacts 20, 22 may be doped semiconductor contacts grown in place, etched out regions of the semiconductor material for metal contacts, or other techniques may be applied. A suitable optical source will be an optical source having sufficient intensity to allow the PCSS to carry the desired amount of current. The optical source 16 may illuminate the PCSS switches 10 from their edges, i.e. parallel to the thin-film layers, or straight through the thin-film stack, i.e. perpendicular to the thin-film layers, or any angle in between. Ideally, the illumination is distributed evenly across the entire face of the device 10 in order to maximize efficiency.

The thin-film PCSS may be operated in either a linear, low-gain mode, turning on and off in sync with the optical trigger, or in a non-linear, high-gain mode, turning on with the optical trigger and remaining on until the voltage supply drops below a PCSS material dependent threshold.

Figure 3A:
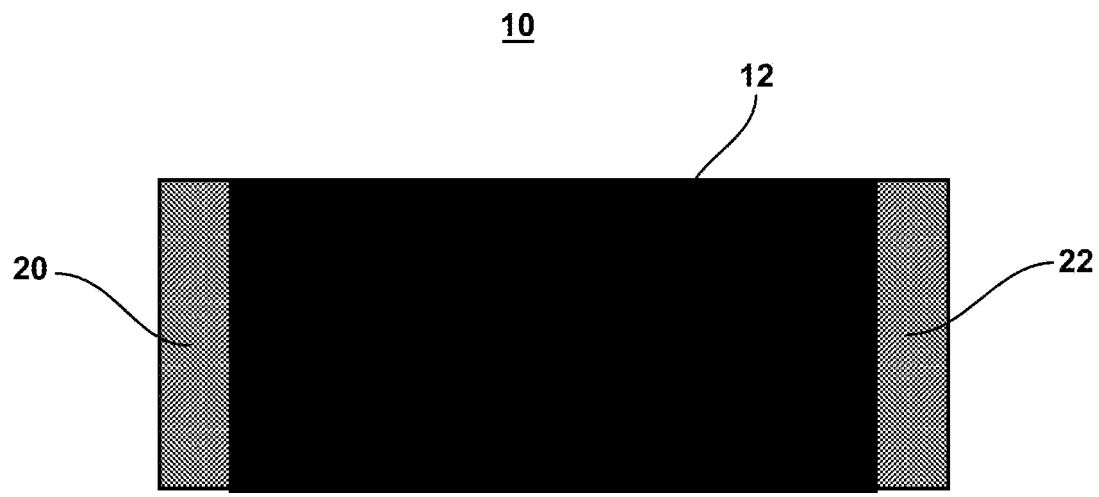
FIG. 3 is are top views of PCSS devices.
Figure 3B:
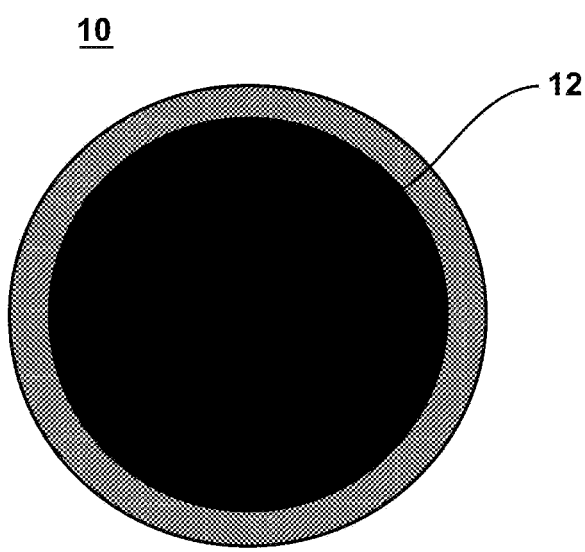

The device described may be made by depositing alternating layers of PCSS and insulating materials via, for example, atomic layer deposition (ALD) or molecular beam epitaxy (MBE). It may then be processed using ordinary semiconductor fabrication techniques, and have contacts adhered to its edges for packaging. FIG. 3 illustrates two possible configurations of the PCSS device 10, i.e. a rectangular and a circular arrangement. These arrangements or other may be selected to meet the requirements of the particular application.

The invention may be used as a replacement for spark gap and conventional transistor switches in high-voltage applications. When it is desired that the thin-film PCSS conduct current, a signal to turn on an optical source is sent. When the photons from the optical source impact the PCSS, the PCSS turns from an "off" state into a conductive "on" state. Depending on the mode of operation of the PCSS, it will either conduct electricity until the voltage supplied to it drops below a certain level, or it will stop conducting when the optical source is turned off.

Multiple wide bandgap semiconductors may be used for the PCSS in the invention, including but not limited to GaAs, GaN, and AlN. All of these materials exhibit both linear and non-linear modes of operation. A variety of optical sources may be used, as long as they provide enough energy at the correct wavelength for a given material. GaAs is a suboptimal choice however, because it lacks durability compared to GaN or AlN.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A photoconductive semiconductor switch (PCSS) comprising:
   a plurality of planar semiconductor layers, adjacent semiconductor layers separated by an insulation layer, forming a thin-film stack;
   a pair electrical contacts fixed to a perimeter of each of the semiconductor layers;
   an optical source arranged to project light of a predetermined wavelength through the plurality of semiconductor layers; and
   wherein a lattice of a semiconductor material of the plurality of planar semiconductor layers and a lattice of an insulating material of the insulation layer are matched so that strain and defects are minimal therein.

2. The photoconductive semiconductor switch of claim 1, wherein the thin-film stack comprises at least 3 layers of alternating semiconductor and insulating layers.

3. The photoconductive semiconductor switch of claim 1, wherein the semiconductor and insulator layers consist of at least one of GaAs, GaN, GaP, AlN, GaSe, ZnSe, ZnTe, GaSb, InAs, GaN, AlAs, InP, CdS, InSe, CdTe, HgTe, InSb, AlSb, AlGaN, Si, C (diamond), and SiC.

4. The photoconductive semiconductor switch of claim 1, wherein the contacts consist of at least one of a doped semiconductor material, Sc, Ti, V, Cr, Mn, Fe, Co, Ni, Cu, Zn, Y, Zr, Nb, Mo, Ru, Rh, Pd, Ag, Cd, Ir, Pt, and Au.

5. The photoconductive semiconductor switch of claim 1, wherein the optical source illuminates the thin-film stack from at least one of their edges, i.e. parallel to the thin-film layers, or straight through the thin-film stack, i.e. perpendicular to the thin-film layers, or any angle in between.

6. The photoconductive semiconductor switch of claim 1, wherein the lattice of the semiconductor material of the plurality of planar semiconductor layers and the lattice of the insulating material of the insulation layer are matched to form quantum wells so that charge conduction along an interface therebetween is increased.

7. A photoconductive semiconductor switch (PCSS) comprising:
   a plurality of planar semiconductor layers, adjacent semiconductor layers separated by an insulation layer, forming a thin-film stack;

a pair electrical contacts fixed to a perimeter of each of the semiconductor layers;

an optical source arranged to project light of a predetermined wavelength through the plurality of semiconductor layers; and wherein a lattice of a semiconductor material of the plurality of planar semiconductor layers and a lattice of an insulating material of the insulation layer are matched to form quantum wells so that charge conduction along the interface is increased.

8. The photoconductive semiconductor switch of claim 7, wherein the thin-film stack comprises at least 3 layers of alternating semiconductor and insulating layers.

9. The photoconductive semiconductor switch of claim 7, wherein the semiconductor and insulator layers consist of at least one of GaAs, GaN, GaP, AlN, GaSe, ZnSe, ZnTe, GaSb, InAs, GaN, AlAs, InP, CdS, InSe, CdTe, HgTe, InSb, AlSb, AlGaN, Si, C (diamond), and SiC.

10. The photoconductive semiconductor switch of claim 7, wherein the contacts consist of at least one of a doped semiconductor material, Sc, Ti, V, Cr, Mn, Fe, Co, Ni, Cu, Zn, Y, Zr, Nb, Mo, Ru, Rh, Pd, Ag, Cd, Ir, Pt, and Au.

11. The photoconductive semiconductor switch of claim 7, wherein the optical source illuminates the thin-film stack from at least one of their edges, i.e. parallel to the thin-film layers, or straight through the thin-film stack, i.e. perpendicular to the thin-film layers, or any angle in between.

\* \* \* \* \*